United States Patent [19]
Ponce

[11] Patent Number: 6,056,256
[45] Date of Patent: *May 2, 2000

[54] METHOD FOR SEPARATING ELECTRONIC EQUIPMENT MODULES USING SPACER DEVICES

[76] Inventor: Karen Elizabeth Rivera Ponce, 19042 Ervin La., Santa Ana, Calif. 92705

[ * ] Notice: Under 35 U.S.C. 154(b), the term of this patent shall be extended for 00 days.

[21] Appl. No.: 09/219,543

[22] Filed: Dec. 18, 1998

[51] Int. Cl.[7] .................................................. F16M 13/00
[52] U.S. Cl. ...................................... 248/346.01; 446/126
[58] Field of Search ........................ 248/346.01, 346.05, 248/346.06, 560, 633, 634, 678, 638; 403/170, 174, 176; D21/488, 503; 446/85, 126, 128

[56] References Cited

U.S. PATENT DOCUMENTS

| | | | |
|---|---|---|---|
| 1,113,371 | 10/1914 | Pajeau | 406/176 |
| 1,446,868 | 2/1923 | Baker | 446/126 |
| 2,313,357 | 3/1943 | Pajeau | 446/126 |
| 2,709,318 | 5/1955 | Benjamin | 403/176 |
| 3,286,391 | 11/1966 | Mengeringhausen | 403/176 |
| 4,129,975 | 12/1978 | Gabriel | 446/126 |
| 4,501,460 | 2/1985 | Sisler | 339/49 |
| 4,635,811 | 1/1987 | Lodi | 220/69 |
| 5,604,662 | 2/1997 | Anderson et al. | 361/685 |
| 5,655,460 | 8/1997 | Boonstra | 108/55.3 |
| 5,666,271 | 9/1997 | Kim et al. | 361/726 |
| 5,671,120 | 9/1997 | Kikinski | 361/687 |
| 5,685,441 | 11/1997 | Calfee | 248/346.01 X |
| 5,737,189 | 4/1998 | Kammersgard et al. | 361/726 |
| 5,758,755 | 6/1998 | Jordan et al. | 248/346.01 |
| 5,796,578 | 9/1998 | Jones | 361/683 |
| 5,808,871 | 9/1998 | Rosecan et al. | 361/730 |
| 5,809,904 | 9/1998 | Darby | 108/55.3 |
| 6,004,182 | 12/1999 | Pasin | 446/126 |

*Primary Examiner*—Leslie A. Braun
*Assistant Examiner*—A. Joseph Wujciak, III
*Attorney, Agent, or Firm*—Eric Karich

[57] ABSTRACT

A spacer device for separating electronic equipment modules has a plurality of spacing elements held together by a plurality of rigid interconnection rods. The spacer device increases the amount of available storage space in a given area by allowing units to be stacked vertically. The interconnection rods provide a terminal element at each opposing end thereof, each of the terminal elements being adapted for being pressed into an engagement hole in the spacing elements for capture of the interconnection rod therein by a rod capturing chamber of the spacing element. In use, the spacer device is positioned between two electronic equipment modules to improve ventilation around the electronic equipment modules, thereby facilitating the cooling of the electronic equipment modules. The electronic equipment modules may be fastened together with a plurality of inelastic earthquake bracing devices to prevent excessive movement of the electronic equipment modules.

2 Claims, 2 Drawing Sheets

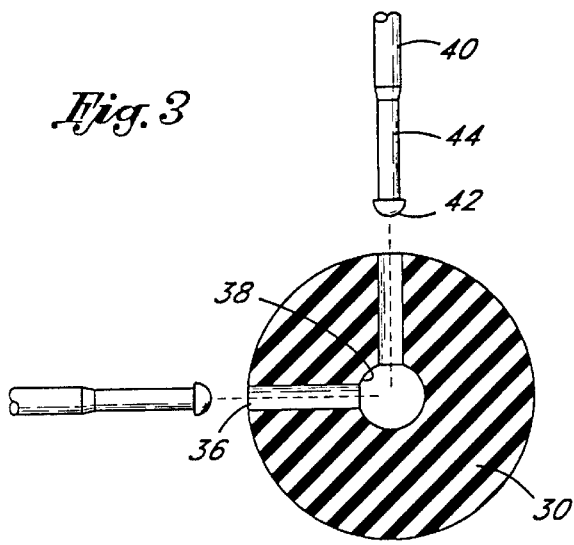
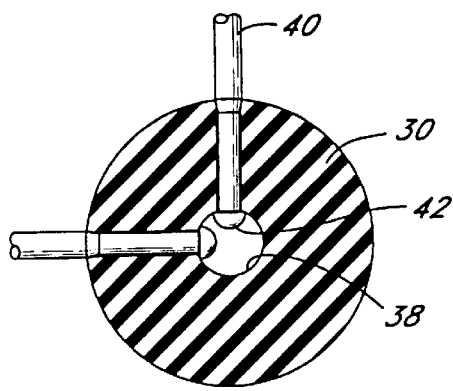
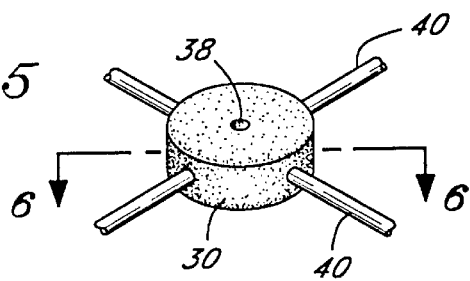
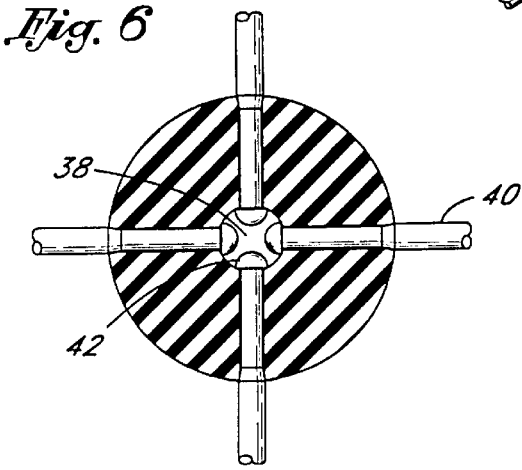
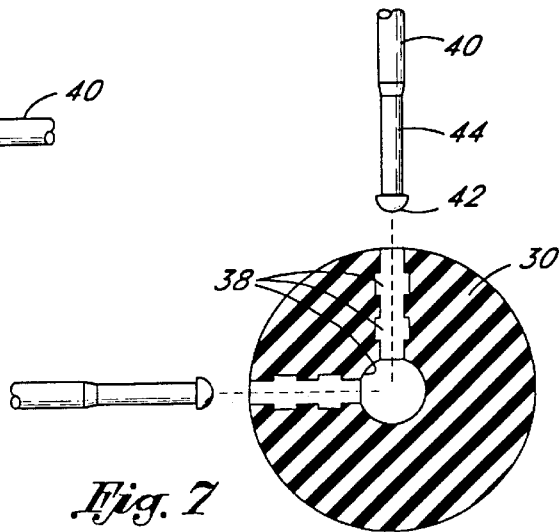

METHOD FOR SEPARATING ELECTRONIC EQUIPMENT MODULES USING SPACER DEVICES

BACKGROUND OF THE INVENTION

1. Field of the Invention

This invention relates generally to a spacer device for supporting an article above a surface, and more particularly to a plurality of interconnected spacing elements that facilitate the storage of multiple electronic equipment modules in a given area, and that support the requirements for ventilation and cooling of the electronic equipment modules.

2. Description of Related Art

In the field of electronics there is a great need to store a substantially growing number of electronic devices such as computers in restricted spaces. Central computer rooms often require raised floors, specialized fire suppression systems, and high security. These rooms are relatively expensive to maintain and difficult to increase in size. Meanwhile, computer departments are continually purchasing computer systems to meet the growing need for computers to conduct business.

While computer storage space has become more limited, computers have also become more powerful, thereby producing greater amounts of heat. Stacking computers vertically has become the norm in the field due to limited space; however, stacking computers without specialized equipment would restrict convection cooling of the computers, creating a real danger of overheating and damage to the computers. There is a clear need in the field for a device that allows computers to be stacked while enhancing air circulation around the stacked computers.

Plastic and rubber spacers are known in the art. For example, Boonstra, U.S. Pat. No. 5,655,460, discloses interconnectible plastic spacers for supporting an article above a surface. Other similar structures are found in Darby, U.S. Pat. No. 5,809,904, which discloses a pallet for supporting a plurality of packages. However, these types of spacers were not designed for, nor are they particularly suitable for, stacking computers.

In the field of electronic devices, and particularly computers, stacking devices have generally taken the form of a specialized rack system. One example of such a rack system is disclosed in Kim, U.S. Pat. No. 5,666,271. While mounting computer servers in a rack system is effective in maintaining proper ventilation, it tends to be expensive. A rack system requires furniture structures and cabinets to support the rack system. Furthermore, both the rack system and the furniture structures tie the consumer into a specific manufacturer for the more complex and often specialized parts necessary to maintain the system.

Other space-saving devices known in the prior art include modular computer casings. Examples of modular computer casings are found Anderson, U.S. Pat. No. 5,604,662, which discloses an expandable modular data storage system; Sisler, U.S. Pat. No. 4,501,460, which discloses a computer housing with a modular latching design; Kammersgard, U.S. Pat. No. 5,737,189, which discloses a stackable, interlocking modular peripheral containment enclosure; Rosecan, U.S. Pat. No. 5,808,871, which discloses a modular computer tower assembly having a plurality of bays, each bay having individual rail mounted trays; and Lodi, U.S. Pat. No. 4,635,811, which discloses a modular computer frame with retractable stabilizers. These modular structures are useful; however, they suffer from the substantial disadvantage of not working with existing equipment.

Another group of patents, not directly involved in stacking computers, highlights the need for stacking technology. These patents disclose heat sink technologies that require the computer casing itself to dissipate excess heat. Kikinisi, U.S. Pat. No. 5,671,120, discloses a computer case having a metal sidewall, the sidewall acting as a heat sink to dissipate heat from the CPU and other components. Jones, U.S. Pat. No. 5,796,578, discloses a metal casing used with a portable computer, the casing providing for additional heat dissipation. These systems, which may become necessary as computers get faster and run hotter, will not function if several hot computers are stacked on top of each other.

The prior art teaches spacing devices for general use. The prior art also teaches rack systems and modular computer cases for electronics devices. However, the prior art does not teach a simple spacing device that allows existing electronic modules such as computer servers to be stacked on top of each other without the use of complex equipment. And without a spacing device, stacked computers would overheat. The present invention fulfills these needs and provides further related advantages as described in the following summary.

SUMMARY OF THE INVENTION

The present invention teaches certain benefits in construction and use which give rise to the objectives described below.

The present invention provides a spacer device for separating electronic equipment modules. The spacer device includes a plurality of spacing elements held together by a plurality of rigid interconnection rods. The interconnection rods provide a terminal element at each opposing end thereof, with each of the terminal elements being adapted to be pressed into an engagement hole in the spacing elements for capture of the interconnection rod therein by a means for capturing the interconnection rods. The spacer device is positioned between two electronic equipment modules to facilitate storage while maintaining ventilation around the electronic equipment modules, thereby facilitating the cooling of the electronic equipment modules. In an optional embodiment, a plurality of the electronic equipment modules are fastened together with a plurality of inelastic earthquake bracing devices.

A primary objective of the present invention is to provide a spacer device having advantages not taught by the prior art.

Another objective is to provide a spacer device that allows the stacking of a plurality of electronic equipment modules without causing the electronic equipment modules to overheat due to lack of air circulation.

A further objective is to provide a spacer device that provides a solid base for stacked electronic equipment modules.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings:

FIG. 3 is an exploded partial top plan sectional view of a single spacing element with the terminal element of two interconnecting rods positioned for insertion into two engagement holes of the spacing element;

FIG. 4 is a sectional view taken along line 4—4 in FIG. 2 showing the terminal elements of a pair of interconnection rods seated in a rod capturing chamber;

FIG. 5 is a perspective view of a second embodiment of a spacing element;

FIG. 6 is a sectional view taken along line 6—6 in FIG. 5 showing the terminal elements of a plurality of rods seated in the rod capturing chamber; and FIG. 7 is an exploded partial top plan sectional view of a third embodiment of a spacing element showing engagement holes with multiple rod capturing chambers.

DETAILED DESCRIPTION OF THE INVENTION

Figure 1:
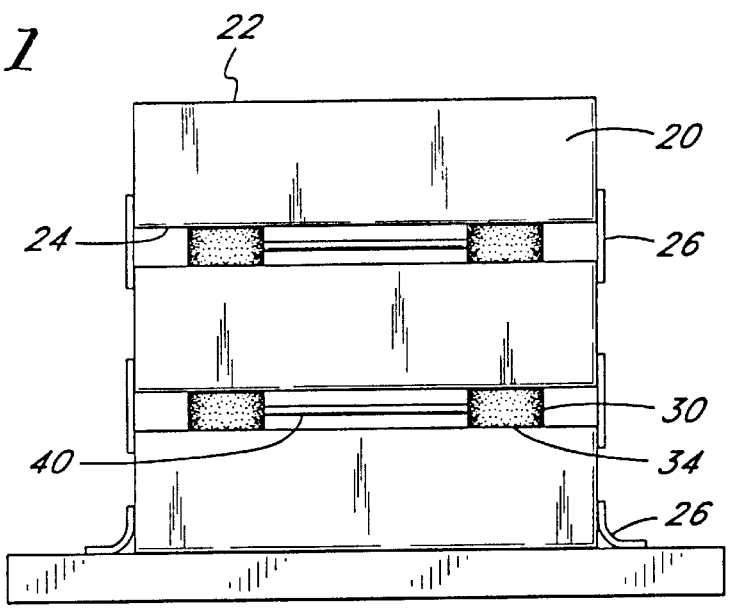
FIG.1 is a front elevational view of two spacer devices positioned to stack and separate three electronic equipment modules, the view showing the use of earthquake bracing devices to protect the stack of electronic equipment modules from excessive movement in the event of an earthquake or other disturbance.

The above described drawing figures generally illustrate the invention, a spacer device 10 for separating electronic equipment modules 20. The spacer device 10 includes a plurality of spacing elements 30 held together by a plurality of rigid interconnection rods 40. The spacer device 10 is positioned between two electronic equipment modules 20 to improve ventilation around the electronic equipment modules 20, thereby facilitating the cooling of the electronic equipment modules 20. As shown in FIG. 1, the electronic equipment modules 20 may be fastened together by a plurality of inelastic earthquake bracing devices 26.

Figure 2:
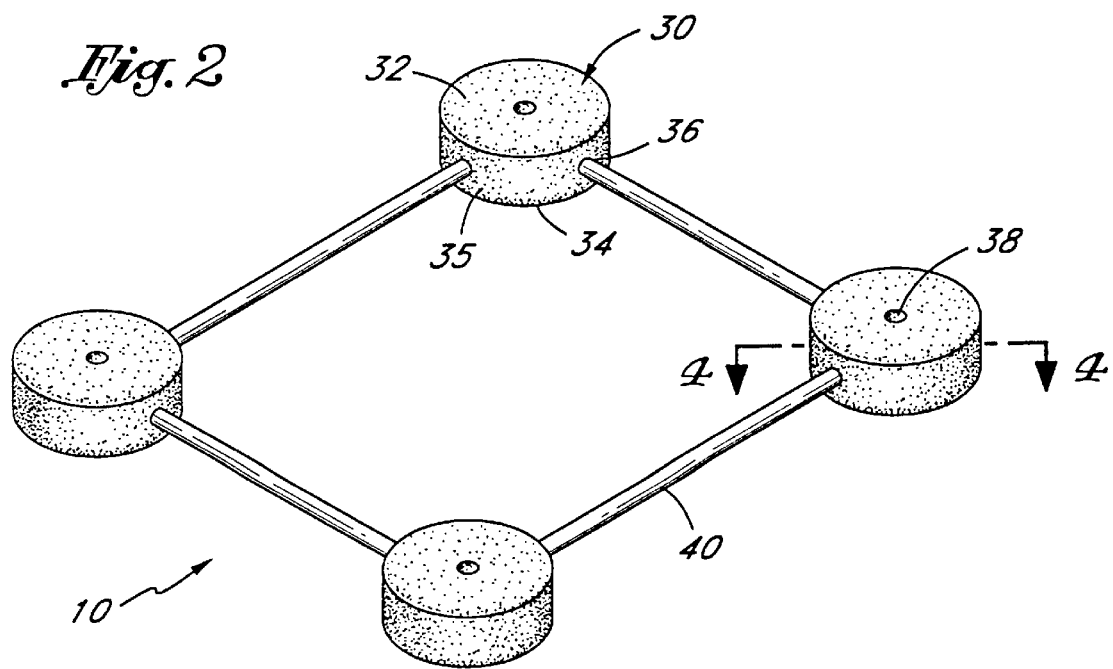
FIG. 2 is a perspective view of the preferred embodiment of a stacking device of the present invention.

As shown in FIG. 2, the spacer device 10 includes a plurality of compliant spacing elements 30. Each of the spacing elements 30 has a top surface 32 and, parallel with the top surface 32, a bottom surface 34. The top and bottom surfaces 32 and 34 are spaced apart so as to define a side surface 35 of the spacing element 30, the side surface 35 joining the top and bottom surfaces 32 and 34. As shown in FIGS. 2 and 3, the side surface 35 preferably provides at least one engagement hole 36 therein, as described more fully below. The spacing elements 30 are preferably sturdy and relatively incompressible, and they preferably provide a high friction, skid-resistant surface that does not scratch the surface of the of the electronic equipment modules 20 or the base surface on which they are stored. The spacing elements 30 may take any desired shape and may be made from many materials, but are most preferably rubber or neoprene cylinders similar in shape to a hockey puck. The spacing elements 30 preferably have a hardness of approximately 45–50 on a durometer. In an alternative embodiment, the spacing elements 30 are made of an alternative material such as plastic, the alternative material being coated with a rubber surface to provide the required qualities. Each spacing element 30 must be thick enough to promote ventilation between the pairs of electronic equipment modules 20; and the spacing elements 30 must have a diameter large enough to provide a solid base for the electronic equipment modules 20. The preferred size of each spacing element 30 is approximately 1.2 inches high and 2 inches in diameter; however, due to variation in the size and cooling requirements of various electronic equipment modules 20, those skilled in the art may devise many shapes and sizes that meet these requirements.

As shown in FIGS. 2, 3, and 4, the spacer device 10 includes a plurality of rigid interconnection rods 40 that interconnect the spacing elements 30 to form a unitary structure, as described below. The interconnection rods 40 are preferably made of steel, but other rigid materials such as plastic are also acceptable. A means for joining 42 the spacing elements 30 and the interconnection rods 40 is provided so that the spacing elements 30 and the interconnection rods 40 form a unitary structure wherein all of the top surfaces 32 of the spacing elements 30 are aligned in a common first plane and all of the bottom surfaces 34 of the spacing elements 30 are aligned in a common second plane, the first and second planes being parallel planes. Those skilled in the art may devise many means for joining 42 the spacing elements 30 and the interconnection rods 40. In its preferred embodiment, the means for joining is a terminal element at opposing ends of the interconnection rods 40, the terminal elements 42 cooperating with an engagement hole 36 in the spacing element 30 to join the spacing elements 30 and the interconnection rods 40. Each of the terminal elements 42 is adapted for being pressed into any one of the engagement holes 36 for capture of each of the interconnection rods 40 therein by a means for capturing 38 the interconnection rods 40. As shown in FIG. 3, the terminal element 42, is preferably an enlarged end having a rounded shape that slides into one of the engagement holes 36, but acts as a barb or stop to prevent the interconnection rod 40 from being easily withdrawn. The interconnection rod 40 may include a narrow neck 44 at the base of the terminal element 42 to allow a better fit of the interconnection rod 40 into the engagement hole 36. The narrow neck 44 also serves to increase the hold of the terminal element 42, thus promoting an improved capture of the terminal element 42 within the means for capturing 38. The means for capturing 38 is preferably a rod capturing chamber within the engagement hole 36. The rod capturing chamber 38 is adapted to accept the terminal element 42, as shown in FIG. 4, and securely hold the interconnection rod 40 to the spacing element 30. While the use of a terminal element 42 is preferred, many alternative structures may be devised by those skilled in the art. In one alternative embodiment, the interconnection rods 40 may be glued into the engagement holes 36. In another alternative embodiment, a single interconnection rod 40, bent into a two-dimensional shape, may be molded into the spacing elements 30, thereby joining the interconnection rod 40 and the spacing elements 30. Various alternative constructions may be devised by those skilled in the art without deviating from the scope of this invention.

In a third embodiment, as shown in FIG. 7, each engagement hole 36 includes at least two linearly spaced rod capturing chambers 38. The rod capturing chambers 38 are each adapted to accept the terminal element 42 but not easily release the terminal element 42. By providing a plurality of rod capturing chambers 38, the size of the spacer device 10 may be adjusted by moving the terminal element 42 from rod capturing chamber 38 to rod capturing chamber 38. In an alternative embodiment, the interconnection rods 40 themselves may be adjustable in length, for example by telescoping or by use of a turnbuckle (not shown), to adjust the size of the spacer device 10. Finally, a shelf (not shown) made of rigid material such as wood or plastic may be placed between the top surface of the spacer device 10 and bottom module surface of one of the electronic equipment modules 20, the shelf thereby enabling the spacer device 10 to support electronic equipment modules 20 of different sizes and shapes.

In its preferred embodiment, as shown in FIG. 2, the spacer device 10 includes four spacing elements 30; and each spacing element 30 includes two engagement holes 36, the engagement holes 36 being radially spaced 90 degrees apart. When assembled so that the spacing elements 30 are joined by the interconnection rods 40 to form a unitary structure, the four spacing elements 30 are arranged in a rectangle having dimensions of 8–14 inches by 8–24 inches. All of the top surfaces 32 of the spacing elements 30 are aligned in a common first plane; and all of the bottom surfaces 34 of the spacing elements 30 are aligned in a common second plane, the first and second planes being parallel planes. This configuration provides great stability in supporting a pair of electronic equipment modules 20 in a stacked relationship. While this configuration is preferred, those skilled in the art may devise many shapes and configurations that meet the requirements of this invention. As shown in FIG. 5 and 6, the spacing elements 30 may have a plurality of engagement holes 36 spaced around the spacing elements 30 for building spacer devices 10 of different shapes and sizes. Another example, not shown, would be to provide two engagement holes 36 radially spaced 60 degrees apart, thereby enabling the construction of a triangular spacer device 10. Those skilled in the art may devise many such shapes without adding to the teachings of this invention.

The invention includes a method for stacking electronic equipment modules 20 to provide improved ventilation for the purpose of heat dissipation to prevent the electronic equipment modules 20 from overheating. The method teaches the use of the above-described spacer device 10 to stack at least two electronic equipment modules 20, each electronic equipment module 20 having a top module surface 22 and a bottom module surface 24. A plurality of the above-described spacing elements 30 are interconnected by pressing the terminal elements 42 of each of the interconnection rods 40 into one of the engagement holes 36 of the spacing elements 30, the terminal element 42 being thereby captured therein, so that the spacing elements 30 are joined by the interconnection rods 40 to form a unitary structure wherein all of the top surfaces 32 of the spacing elements 30 are aligned in a common first plane and all of the bottom surfaces 34 of the spacing elements 30 are aligned in a common second plane, the first and second planes being parallel planes. The unitary structure of the interconnected spacing elements 30 is then placed onto the top module surface 22 of one of the electronic equipment modules 20; and the other electronic equipment module 20 is placed on top of the unitary structure of the interconnected spacing elements 30, causing the bottom module surface 24 to contact the top surface 32 of the spacing elements 30, thereby formed a stack of the electronic equipment modules 20. Further spacer devices 10 and electronic equipment modules 20 may be stacked in this fashion without cutting off the circulation and convection of air in and around the electronic equipment modules 20. This allows stacking and close storage of many electronic equipment modules 20 without causing the electronic equipment modules 20 to overheat.

Once the electronic equipment modules 20 have been stacked in this fashion, a plurality of inelastic earthquake bracing devices 26 may be attached to each of the electronic equipment modules 20, as shown in FIG. 1. The earthquake bracing devices 26, preferably straps of inelastic material such as nylon, are attached to the electronic equipment modules 20 with a means for bonding, preferably an adhesive or cement. Once the earthquake bracing devices 26 are secured between and bonded to the electronic equipment modules 20, the electronic equipment modules 20 are held in place and prevented from excess movement in case of an earthquake or other significant disturbance.

While the invention has been described with reference to at least one preferred embodiment, it is to be clearly understood by those skilled in the art that the invention is not limited thereto. Rather, the scope of the invention is to be interpreted only in conjunction with the appended claims.

What is claimed is:

1. A method for stacking electronic equipment modules to provide improved ventilation to prevent the electronic equipment modules from overheating, the method comprising the steps of:

a) providing at least two electronic equipment modules, each electronic equipment module having a top module surface and a bottom module surface;

b) providing a plurality of compliant spacing elements, each of the spacing elements having a top surface and, parallel with the top surface, a bottom surface; the top and the bottom surfaces being spaced apart so as to define a side surface of the spacing element, the side surface joining the top and bottom surfaces and providing at least one engagement hole therein;

c) providing a plurality of rigid interconnection rods, each of the interconnection rods having a terminal element at opposing ends thereof;

d) interconnecting a plurality of spacing elements by pressing the terminal elements of the interconnection rods into one of the engagement holes of one of the spacing elements, the terminal element being thereby captured therein, so that the spacing elements are joined by the interconnection rods to form a unitary structure wherein all of the top surfaces of the spacing elements are aligned in a common first plane and all of the bottom surfaces of the spacing elements are aligned in a common second plane, the first and second planes being parallel planes;

e) placing the unitary structure of the interconnected spacing elements onto the top module surface of one of the electronic equipment modules; and f) placing the other electronic equipment module on top of the unitary structure of the interconnected spacing elements.

2. The method of claim 1 further comprising the step of:

g) providing a plurality of inelastic earthquake bracing devices and a means for bonding the earthquake bracing devices to the electronic equipment modules; and h) bonding each of the earthquake bracing devices to each of the electronic equipment modules with the means for bonding.

\* \* \* \* \*